(12) United States Patent
Meiser et al.

(10) Patent No.: US 8,368,177 B2
(45) Date of Patent: Feb. 5, 2013

(54) INTEGRATED CIRCUIT WITH ESD STRUCTURE

(75) Inventors: Andreas Peter Meiser, Sauerlach (DE); Gerhard Prechtl, St. Jacob i. Rosental (AT); Nils Jensen, Feldkirchen-Westerham (DE)

(73) Assignee: Infineon Technologies AG, Neubiberg (DE)

(*) Notice: Subject to any disclaimer, the term of this patent is extended or adjusted under 35 U.S.C. 154(b) by 104 days.

(21) Appl. No.: 12/905,156

(22) Filed: Oct. 15, 2010

(65) Prior Publication Data

US 2011/0089532 A1 Apr. 21, 2011

(30) Foreign Application Priority Data

Oct. 16, 2009 (DE) .................. 10 2009 049 671

(51) Int. Cl.
*H01L 21/70* (2006.01)
*H01L 29/66* (2006.01)
*H01L 29/00* (2006.01)
*H01L 21/20* (2006.01)

(52) U.S. Cl. ........ 257/552; 438/382; 438/309; 438/329; 257/544; 257/546; 257/536

(58) Field of Classification Search .......... 257/528–564; 438/381–399
See application file for complete search history.

(56) References Cited

U.S. PATENT DOCUMENTS

| | | | |
|---|---|---|---|
| 5,291,051 A | 3/1994 | Hoang et al. | |
| 5,465,189 A * | 11/1995 | Polgreen et al. | 361/58 |
| 5,475,273 A * | 12/1995 | Paparo et al. | 327/545 |
| 5,640,299 A * | 6/1997 | Leach | 361/56 |
| 5,734,541 A * | 3/1998 | Iniewski et al. | 361/111 |
| 5,814,865 A * | 9/1998 | Duvvury et al. | 257/360 |
| 7,327,541 B1 * | 2/2008 | Wang et al. | 361/56 |
| 2003/0227053 A1 | 12/2003 | Nomura et al. | |

FOREIGN PATENT DOCUMENTS

DE 19720374 C2 11/1997

* cited by examiner

*Primary Examiner* — Fernando L Toledo
*Assistant Examiner* — Karen Kusumakar
(74) *Attorney, Agent, or Firm* — Murphy, Bilak & Homiller, PLLC

(57) ABSTRACT

An integrated circuit includes a semiconductor body of a first conductivity type. The semiconductor body includes a first semiconductor zone of a second conductivity type opposite the first conductivity type. The first semiconductor zone extends to a surface of the semiconductor body. A second semiconductor zone of the first conductivity type is embedded in the first semiconductor zone and extends as far as the surface. A third semiconductor zone of the second conductivity type at least partly projects from the first semiconductor zone along a lateral direction running parallel to the surface. A contact structure provides an electrical contact with the first and second semiconductor zones at the surface. The second semiconductor zone is arranged, along the lateral direction, between the part of the third semiconductor zone which projects from the first semiconductor zone and a part of the contact structure in contact with the first semiconductor zone.

20 Claims, 4 Drawing Sheets

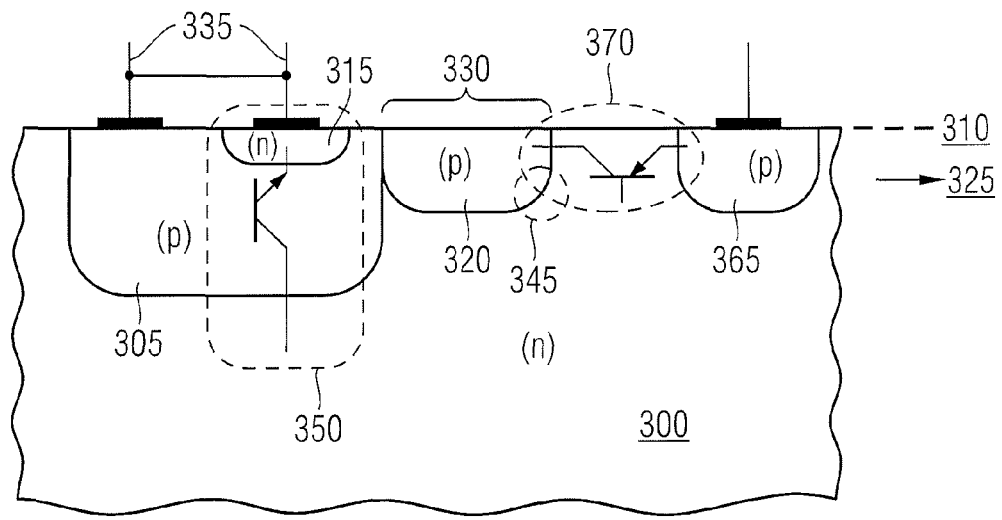
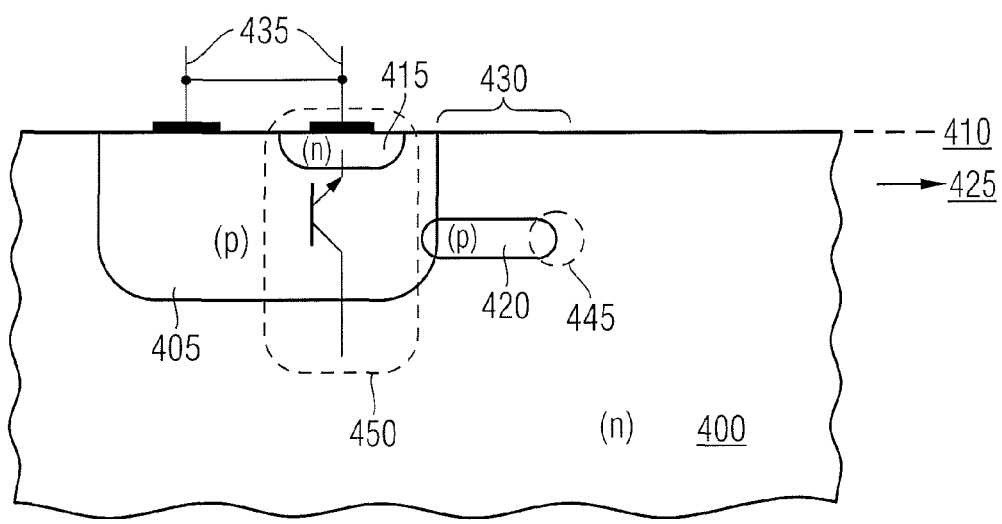

INTEGRATED CIRCUIT WITH ESD STRUCTURE

PRIORITY CLAIM

This application claims priority from German Patent Application No. 10 2009 049 671.8 filed on 16 Oct. 2009, said German Patent Application incorporated herein by reference in its entirety.

FIELD OF THE INVENTION

The invention relates to an integrated circuit with an ESD (electrostatic discharge) structure.

BACKGROUND

ESD structures serve to protect electronic circuit blocks against electrostatic discharge pulses or further current pulses which can occur, for instance, during the production of the integrated circuit or during the operation thereof. Examples of such pulses are HBM (HBM: Human Body Model) pulses in accordance with DIN IEC 60749-26, MM (MM: Machine Model) pulses in accordance with DIN IEC 60749-27, CDM (CDM: Charged Device Model) pulses in accordance with DIN IEC 60749-28. Without ESD structures there is the threat of destruction of useful components of the circuit blocks to be protected, e.g. by current or voltage overloading, which can lead for example to short circuits, an increase in leakage currents or else to defective gate oxides. This can lead to the loss of the functionality of the integrated circuit.

ESD structures typically comprise protection elements such as e.g. NPN or PNP bipolar transistors designed therefor, parasitic NPN or PNP bipolar transistors, SCRs (Silicon Controlled Rectifiers) or thyristors. The expression parasitic bipolar transistor is used herein for a sequence of NPN or PNP regions of arbitrary useful components whose NPN or PNP regions can act as a bipolar transistor.

ESD structures typically have breakdown voltages which lie above the maximum operating voltage of the pin to be protected and below the destruction voltage of the useful components connected to said pin. Typically, in the range of these two voltages in the case of an electrostatic discharge process the ESD structure begins to carry away discharge current. In this case, it is desirable for the breakdown voltage of the ESD structure to have a smallest possible separating interval from the maximum operating voltage at the pin to be protected, in order to have available a largest possible voltage window up to the destruction voltage of the useful components for the operation of the ESD structure. Limits are imposed on the minimization of said separating interval for instance by process fluctuations of the breakdown voltage and the temperature dependence of the breakdown voltage.

SUMMARY

According to an embodiment of an integrated circuit, the integrated circuit includes a semiconductor body of a first conductivity type. The semiconductor body has a first semiconductor zone, a second semiconductor zone, a third semiconductor zone and a contact structure. The first semiconductor zone is of a second conductivity type opposite the first conductivity type and extends to a surface of the semiconductor body. The second semiconductor zone is of the first conductivity type and embedded in the first semiconductor zone, extending as far as the surface. The third semiconductor zone is of the second conductivity type and at least partly projects from the first semiconductor zone along a lateral direction running parallel to the surface. The contact structure provides an electrical contact with the first and second semiconductor zones at the surface. The second semiconductor zone is arranged, along the lateral direction, between the part of the third semiconductor zone which projects from the first semiconductor zone and a part of the contact structure in contact with the first semiconductor zone.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis is placed upon illustrating the principles of the invention. Moreover, in the figures, like reference numerals designate corresponding parts. In the drawings:

FIG. 3 shows, in schematic simplification, a cross section through part of an ESD structure with a lateral PNP transistor according to an embodiment.

FIG. 4 shows, in schematic simplification, a cross section through part of an ESD structure in which an electrical breakdown is defined by a semiconductor zone which buried within the semiconductor body and which projects from a further semiconductor zone of the same conductivity type according to an embodiment.

DETAILED DESCRIPTION

The below-described embodiments of the invention and features thereof can in each case be combined with one another in any desired manner, that is to say that there is no restriction to the effect that specific features described in connection with one embodiment could not be combinable with features of another embodiment.

Figure 1:
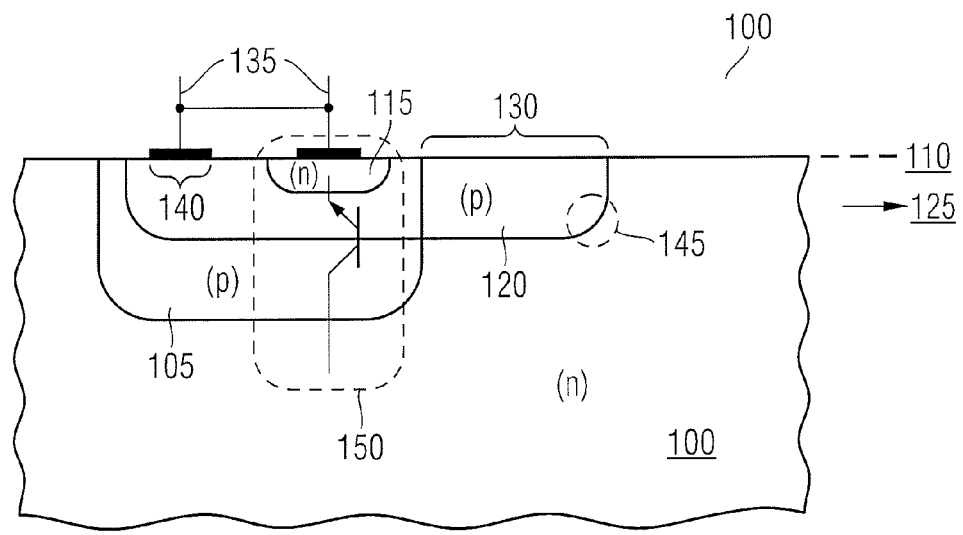
FIG. 1 shows, in schematic simplification, a cross section through part of an ESD structure in which an electrical breakdown is defined by a semiconductor zone which extends to a surface of a semiconductor body and which projects from a further semiconductor zone of the same conductivity type according to an embodiment.

The schematic illustration in FIG. 1 shows a cross section through part of a semiconductor body 100 of the n-type, in which an integrated circuit is formed. There is formed in the semiconductor body 100 a first semiconductor zone 105 of the p-type, which extends to a surface 110 of the semiconductor body 100. A second semiconductor zone 115 of the n-type is embedded within the first semiconductor zone 105. A third semiconductor zone 120 of the p-type is partly embedded in the first semiconductor zone 105 and partly projects from the first semiconductor zone 105 along a lateral direction 125 running parallel to the surface 110. The third semiconductor zone 120 extends as far as the surface 110 of the semiconductor body 100.

That part of the third semiconductor zone 120 which projects laterally from the first semiconductor zone 105 is not electrically contact-connected via the associated surface region 130, but rather via a contact structure 135 in a further surface region 140, which is adjoined by both the first semiconductor zone 105 and the third semiconductor zone 120. The second semiconductor zone 115 is arranged along the lateral direction 125 between that part of the third semiconductor zone 120 which projects from the first semiconductor zone 105 and that part of the contact structure 135 which makes contact with the first semiconductor zone 105 and also the third semiconductor zone 120 in the further surface region 140.

An electrical breakdown voltage between the semiconductor body 100 of the n-type, on the one hand, and the first and third semiconductor zones 105, 120 of the p-type, on the other hand, is defined by the semiconductor body 100 and the third semiconductor zone 120. By way of example, a breakdown location 145 is illustrated in a region of curvature of the third semiconductor zone 120.

In this exemplary embodiment and also in the subsequent exemplary embodiments, the first and third semiconductor zones 105, 120 are of the p-type and the semiconductor body 100 and also the second semiconductor zone 115 are of the n-type. Equally, it is also possible for the first and third semiconductor zones 105, 120 to be of the n-type and the semiconductor body 100 and the second semiconductor zone 115 to be of the p-type.

The semiconductor body 100 can be, for example, an epitaxial layer or a sequence of epitaxial layers which are grown epitaxially on a semiconductor substrate such as a semiconductor wafer. By way of example, the semiconductor substrate can be of the same conductivity type as the semiconductor body, in which case a connection to semiconductor components which are formed in the semiconductor body can be effected both from a front side at the surface of the semiconductor body and at a rear side at the surface of the semiconductor substrate. Equally, the semiconductor substrate can also have an opposite conductivity type to that of the semiconductor body, in which case all electrical connections to semiconductor components can be led via the surface of the semiconductor body, for instance. In this case, the semiconductor body can be electrically contact-connected for example via a buried layer and a trench filled with conductive material or else via a semiconductor connection zone of the same conductivity type as the semiconductor body, said semiconductor connection zone extending as far as the surface. The semiconductor body can also be the semiconductor region of an SOI (Silicon-On-Insulator) substrate. The contact structure 135 can have contact plugs extending to the surface 110, for example. In this case, a first part of the contact plugs can be led onto the further surface region 140 in order to make contact with first and third semiconductor zones 105, 120 and a second part of the contact plugs can be led onto a surface region of the second semiconductor zone 115, for example. Equally, the contact structure 135 can also be led as a continuous contact onto the surface 110 and make contact with both the second semiconductor zone 115 and the first semiconductor zone 105. The contact structure 135 can short-circuit the first and second semiconductor zones (cf. FIG. 1) or else electrically connect these zones to one another via a resistor having a resistance of less than 5Ω, for example.

By way of example, the contact structure 135 produces the contact with the anode of the ESD structure, while a further contact structure (not shown) produces the contact with a cathode of the ESD structure which comprises the semiconductor body 100.

The arrangement of first to third semiconductor zones 105, 115, 120 and also of the contact structure 135 makes it possible to specify an ESD structure having advantageous properties such as an enlarged ESD window. This will be explained by way of example for the case of ESD loading. In the case of ESD loading, a discharge current is carried away via the ESD structure. In this case, firstly the voltage between anode and cathode of the structure rises up to the breakdown voltage between semiconductor body 100 and third semiconductor zone 120. Said breakdown voltage can be produced for example with smaller manufacturing fluctuations than in the case of an ESD structure having a third semiconductor zone defined by outdiffusion from strip-type or plug-type regions, for instance. In the latter case, additional process fluctuations of the breakdown voltage occur which are defined on inaccuracies in the lithographic definition of the strip- or plug-type regions.

A portion, i.e. the hole current, of the breakdown current flowing in the electrical breakdown, such as an avalanche current, flows from the breakdown location 145 to that part of the contact structure 135 which makes contact with the further surface region 140. In this case, an ohmic voltage drop is produced in the third semiconductor zone 120 or along the corresponding part of the first semiconductor zone 105, and this is dependent on the resistivity of said zones. In the case of a short circuit or a low-resistance connection between the first semiconductor zone 105 and the second semiconductor zone 115 via the contact structure 135, said voltage drop has the effect that a parasitic NPN bipolar transistor 150 turns off. The emitter of the parasitic bipolar transistor 150 is formed by the second semiconductor zone 115 of the n-type, the base of the parasitic bipolar transistor is formed by the first and third semiconductor zones 105, 120, and the collector of the parasitic bipolar transistor is formed by the semiconductor body 100. This parasitic bipolar transistor carries away the discharge current in the case of ESD loading.

While the first semiconductor zone 105 concomitantly determines the properties of the parasitic bipolar transistor 150 such as the current gain 13, for instance, e.g. by way of the dopant concentration and the depth of said zone, the third semiconductor zone 120 determines the electrical breakdown voltage. Consequently, in an advantageous manner, it is possible to obtain a spatial decoupling between electrical breakdown location 145 and location of the parasitic bipolar transistor 150 which carries away the discharge current, such that the properties of the electrical breakdown and of the parasitic bipolar transistor can be optimized independently of one another by way of the configuration of the first and third semiconductor zones 105, 120.

Figure 2:
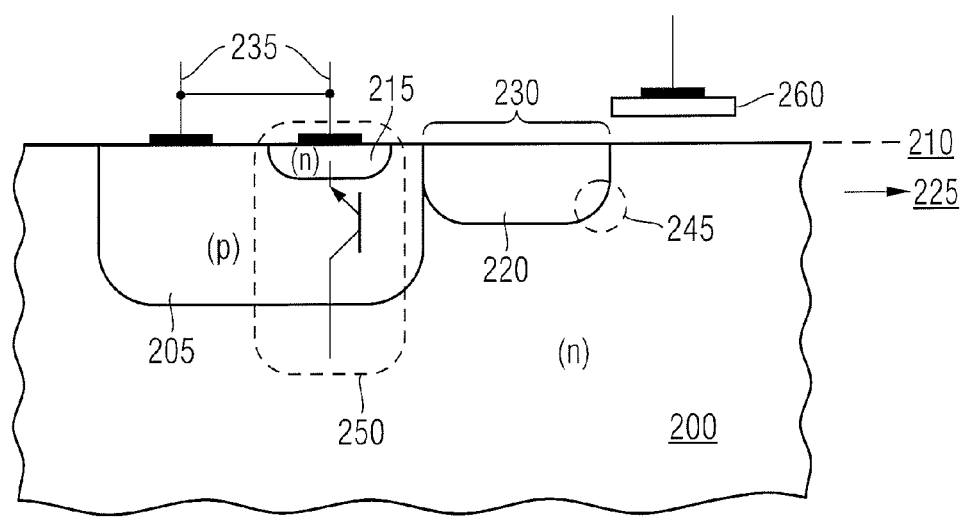
FIG. 2 shows, in schematic simplification, a cross section through part of an ESD structure with a field plate for influencing the electric field profile in the region of the electrical breakdown according to an embodiment.

The schematic illustration in FIG. 2 shows a cross section through part of a semiconductor body 200 of the n-type, in which, similarly to the arrangement shown in FIG. 1, first, second and third semiconductor zones 205, 215, 220 are formed within the semiconductor body 200 and electrically contact-connected by a contact structure 235 at the surface 210 of the semiconductor body 200. Unlike in the arrangement shown in FIG. 1, the third semiconductor zone 220 does not extend from the part projecting from the first semiconductor zone 205 laterally across the second semiconductor zone 215, but rather laterally adjoins the first semiconductor zone 205 or only slightly overlaps the latter, such that a continuous region of the p-type is present. Compared with the arrangement shown in FIG. 1, this has the consequence that the holes produced in the electrical breakdown in the case of ESD loading experience a comparatively higher resistance with respect to the electrical contact structure 235. In other words, the arrangement shown in FIG. 2 has a comparatively higher parasitic base bulk resistance than the arrangement shown in FIG. 1. The extent of this increase in resistance depends on the ratio of the bulk resistances of the first and third semiconductor zones 205, 220 and hence inter alia on the dopant profile of the corresponding semiconductor zones. With the increase in the base bulk resistance of the parasitic NPN bipolar transistor that carries away the discharge current in the case of ESD loading, the so-called trigger current, corresponding to the current for turning on the parasitic NPN bipolar transistor, can be reduced, whereby it is possible, for example, to obtain more rapid turn-off in the case of ESD loading. Moreover, with the arrangement shown in FIG. 2, it is possible, for example, to obtain a higher current gain β of the parasitic NPN bipolar transistor than with the arrangement shown in FIG. 1 if the dopant concentration of the third semiconductor zone 140 in FIG. 1 is high enough that it contributes to the recombination in the base of the parasitic NPN.

A field plate 260, which can consist for example of a conductive material such as metal or doped semiconductor material such as doped polysilicon, is arranged above the surface 210 in order to influence the electric field curvature in a region between the third semiconductor zone 220 and the semiconductor body 200. By way of example, the field plate 260 is positioned above the breakdown location 245. The field plate is suitable, for example, for preventing a shift in the electrical breakdown voltage which can occur if a portion of the charge carriers produced in the electrical breakdown accumulates in a dielectric at the surface 210 and concomitantly determines the electric field curvature at the breakdown location. In addition, a fine adjustment of the breakdown voltage can be performed to a limited extent, for example, with the field plate 260. The field plate can be electrically short-circuited with the contact structure 235, for example. Moreover, the field plate can be connected to a potential different therefrom.

The schematic illustration in FIG. 3 shows a cross section through part of a semiconductor body 300 of the n-type, in which, similarly to the arrangement shown in FIG. 1, first, second and third semiconductor zones 305, 315, 320 are formed within the semiconductor body 300 and electrically contact-connected by a contact structure 335 at the surface 310 of the semiconductor body 300.

Unlike in the arrangement shown in FIG. 1 and similarly to the arrangement shown in FIG. 2, the third semiconductor zone 320 laterally adjoins the first semiconductor zone 305 or only slightly overlaps the latter, such that a continuous region of the p-type is present.

A fourth semiconductor zone 365 of the p-type, which extends to the surface 310 of the semiconductor body 300, is spaced apart from the second semiconductor zone 320 along the lateral direction 325 and electrically connected to a pin, which is different from the pin to which the first and second semiconductor zones are electrically connected. The first and second semiconductor zones are connected for example to an anode pin such as a ground pin, while the fourth semiconductor zone is connected for example to a cathode pin such as a supply or input/output pin to be protected, for instance. The fourth semiconductor zone 365 forms the emitter of a further parasitic bipolar transistor, namely of a PNP transistor 370, which can be activated in the case of ESD loading. The base of said parasitic PNP bipolar transistor 370 is formed by the semiconductor body 300 of the n-type, and the collector of said PNP bipolar transistor is formed by the first and third semiconductor zones 305, 320. The PNP transistor is driven by means of the collector current of the parasitic NPN bipolar transistor 350. The turn-on of the PNP bipolar transistor can be controlled for example via the interconnection between the fourth semiconductor zone 365 and an electrical connection of the semiconductor body 300. If, for instance, the semiconductor body 300 is contact-connected at the surface 310 and this contact is short-circuited with the contact on the fourth semiconductor zone 365, then the parasitic PNP transistor 370 is driven for example by means of the connector current of the NPN bipolar transistor 350, in particular by means of the voltage drop brought about between the fourth semiconductor zone 365 and the surrounding region of the semiconductor body 300. This voltage drop is dependent, for instance, on the resistance of the semiconductor body 300 and also on the position of the contact with the semiconductor body 300 relative to the fourth semiconductor zone 365. The collector current of the parasitic NPN transistor 350 performs the driving of the PNP transistor and the hole current produced at the breakdown location 345 in the electrical breakdown performs the driving of the NPN transistor 350.

The lateral PNP transistor 370 formed with the fourth semiconductor zone 365 is suitable, for example, for homogenizing the current flow during an ESD discharge. This counteracts for instance current splitting of the parasitic NPN transistor in a plane perpendicular to the plane of the drawing in FIG. 3, that is to say along a width of the component, since a collector current of the parasitic NPN transistor 350 that is concentrated along said perpendicular plane, on account of the spreading of the current in the collector, leads to driving of the PNP parasitic transistor 370 that is more homogeneous in said plane. The PNP transistor 370, for its part, then again drives the parasitic NPN transistor 350 more homogeneously in the perpendicular plane, whereby current splitting is counteracted.

The schematic illustration in FIG. 4 shows a cross section through part of a semiconductor body 400 of the n-type, in which, similarly to the arrangement shown in FIG. 1, first, second and third semiconductor zones 405, 415, 420 are formed within the semiconductor body 400 and are electrically contact-connected by a contact structure 435 at a surface 410 of the semiconductor body 400.

Unlike in the arrangement shown in FIG. 1 and similarly to the arrangement shown in FIG. 2, the third semiconductor zone 420 laterally adjoins the first semiconductor zone 405 or only slightly overlaps the latter, such that a continuous region of the p-type is present. Unlike in the arrangements shown in FIGS. 1 to 3, the third semiconductor zone 420 is buried within the semiconductor body 400, such that this zone does not adjoin the surface 410. By way of example, the third semiconductor zone 420 can be formed by ion implantation with suitably chosen implantation energy and taking account of the thermal budget following the implantation. The burying of the third semiconductor zone 420 within the semiconductor body 400 makes it possible to move the breakdown location 445 into the depth of the semiconductor body and hence away from the surface 410, in order thus to counteract for example an accumulation of charge carriers at the interface and a shift in the electrical breakdown that is possibly associated therewith.

Figure 5:
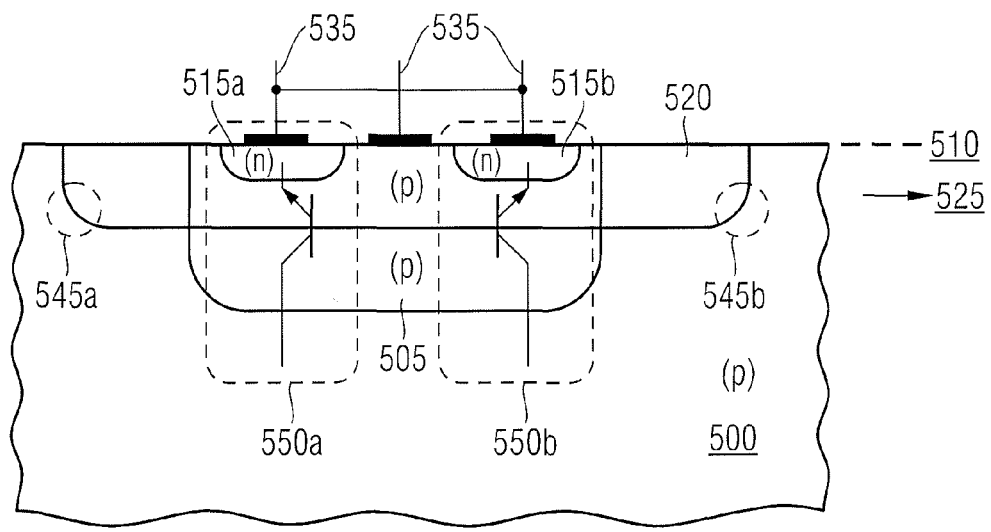
FIG. 5 shows, in schematic simplification, a cross section through part of an ESD structure in which an electrical breakdown is defined by a semiconductor zone which extends to a surface of a semiconductor body and which projects from a further semiconductor zone of the same conductivity type at opposite sides according to an embodiment.

The schematic illustration in FIG. 5 shows a cross section through part of a semiconductor body 500 of the n-type, in which, similarly to the arrangement shown in FIG. 1, first, second and third semiconductor zones 505, 515a, 515b, 520 are formed within the semiconductor body 500 and are electrically contact-connected by a contact structure 535 at a surface 510 of the semiconductor body 500.

Unlike in the arrangement shown in FIG. 1, the third semiconductor zone 520 projects laterally from the first semiconductor zone 505 at opposite sides and second semiconductor zones 515a and 515b are embedded within the first semiconductor zone 505 in such a way that that part of the contact structure 535 which makes contact with the first semiconductor zone 550 is positioned between said second semiconductor zones. A hole current produced at the electrical breakdown location 545a in the electrical breakdown flows away below the second semiconductor zone 515a to the contact structure 535 and drives the parasitic NPN transistor 550a, while a hole current produced in the electrical breakdown at the breakdown location 545b flows below the second semiconductor zone 515b to the contact structure 535 and drives the parasitic NPN transistor 550b. The arrangement of the second and third semiconductor zones can be symmetrical with respect to the center of the first semiconductor zone 505, for example, in the cross-sectional view shown in FIG. 5.

The arrangement shown in FIG. 5 can lead, for example, to an advantageous ESD robustness per area of an ESD structure produced with this arrangement since the discharge current in the case of ESD loading can be carried away via two current paths, namely the first parasitic NPN bipolar transistor 550a and the second parasitic NPN bipolar transistor 550b spatially separated therefrom.

The arrangement shown in cross section in FIG. 5 can extend perpendicularly to the cross section shown in various ways, that is to say that the geometry of an ESD structure produced with these semiconductor zones can be different.

Figure 6A:
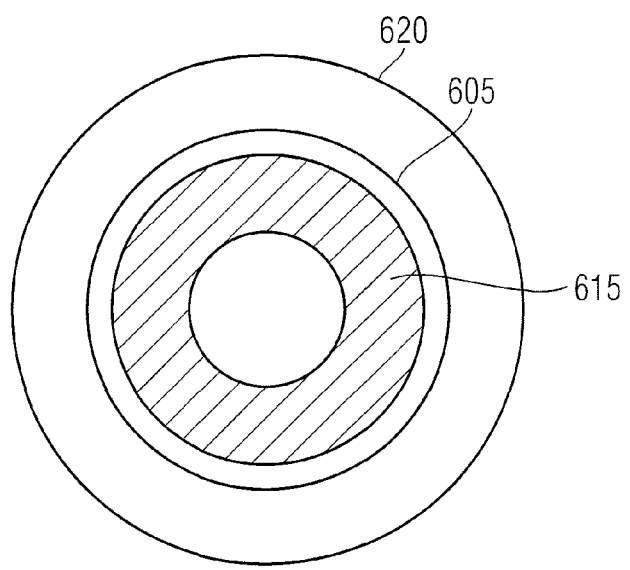
FIG. 6A shows, in schematic simplification, a plan view of the ESD structure shown in FIG. 5 in the case of a radially symmetrical configuration of the semiconductor zones.

By way of example, FIG. 6A shows a plan view of the arrangement shown in FIG. 5 in the case of a radially symmetrical configuration of the semiconductor zones. In this case, the illustration shows the outer edges of the first and second semiconductor zones 605, 620 and also the inner and outer edges of the ring-shaped second semiconductor zone 615. The second semiconductor zones identified by the reference symbols 515a and 515b in FIG. 5 merge to form the ring-shaped second semiconductor zone 615 in the case of a plan view of the embodiment in accordance with FIG. 6.

Figure 6B:
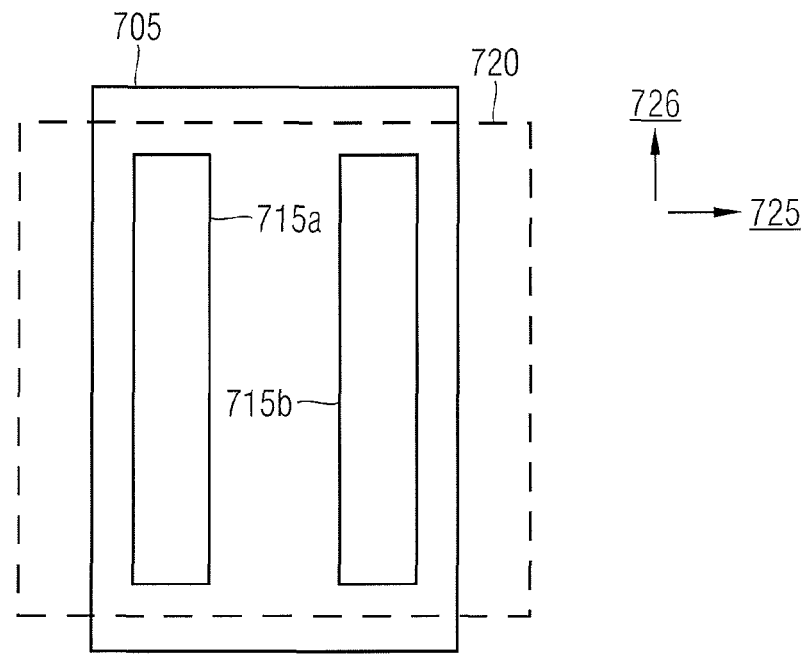
FIG. 6B shows, in schematic simplification, a plan view of the ESD structure shown in FIG. 5 in the case of a strip-type configuration of the semiconductor zones.

By way of example, FIG. 6B shows a plan view of the arrangement shown in FIG. 5 in the case of a strip-type configuration of the semiconductor zones. The outer edges of the first, second and third semiconductor zones 705, 715a, 715b, 720 are illustrated in this case. In the case of the arrangement illustrated, the electrical breakdown can be concentrated for example on those regions in which the third semiconductor zone 720 projects beyond the first semiconductor zone 705. Since the first semiconductor zone 705 projects beyond the third semiconductor zone 720 along the vertical direction 726, the electrical breakdown can be kept away from this region since firstly the third semiconductor zone 720 breaks down with respect to the semiconductor body. The configuration of the corners of the semiconductor zones can also be beveled besides the edges converging at an angle of 90° as illustrated by way of example.

Figure 7:
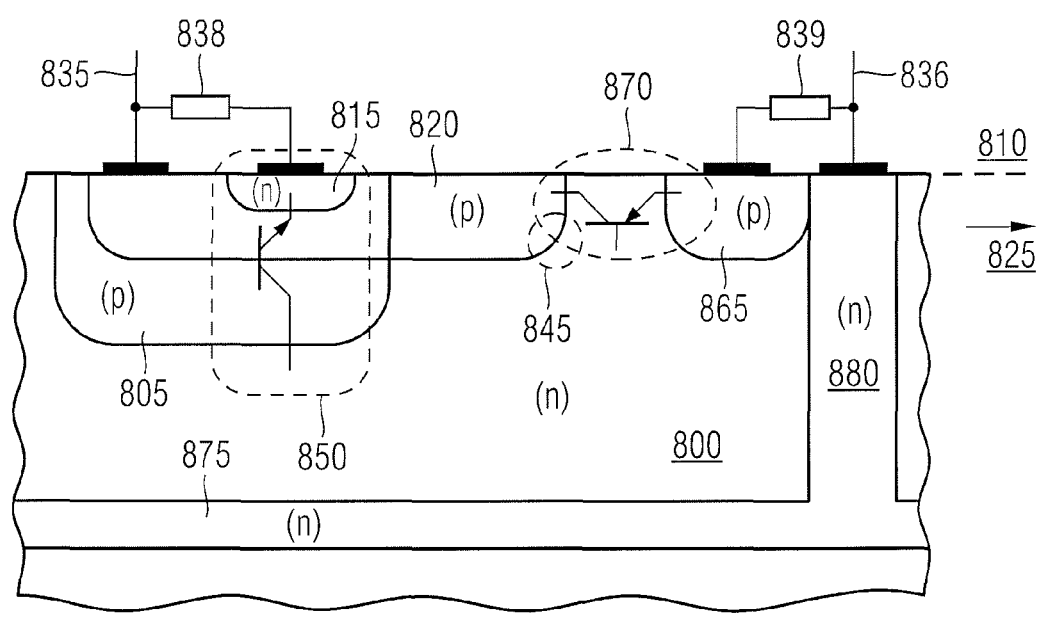
FIG. 7 shows, in schematic simplification, a cross section through an ESD structure with a vertical NPN transistor and a lateral PNP transistor and also emitter series resistors according to an embodiment.

The schematic illustration in FIG. 7 shows a cross section through part of a semiconductor body 800 of the n-type, in which, similarly to the arrangement shown in FIG. 3, first, second, third and fourth semiconductor zones 805, 815, 820 and 865 are formed within the semiconductor body 800 and form part of an ESD structure. The first, second and third semiconductor zones 805, 815, 820 form the anode of the ESD structure and are electrically connected to the contact structure 835 via the surface 810. The semiconductor body 800 is connected to a further contact structure 836 at the surface 810 of the semiconductor body 800 via a buried fifth semiconductor zone 875 of the n-type and a connection pillar 880, e.g. a doped semiconductor pillar of the n-type or a trench comprising conductive material such as doped semiconductor material or metallic material. The semiconductor zones connected to the further contact structure 836 form the cathode of the ESD structure. The further contact structure 836 also makes contact with the fourth semiconductor zone 865 acting as an emitter of the parasitic lateral PNP transistor 870.

An electrical connection between the first semiconductor zone 805 and the second semiconductor zone 815 can have, within the contact structure 835, a resistor 838, e.g. a resistor composed of doped semiconductor material such as doped polysilicon. The resistor 838 can have a resistance of less than 5 ohms, for example. The resistor 838 can extend parallel to the second semiconductor zone 815 for example along a direction running perpendicularly to the plane of the drawing such as, for instance, the vertical direction 726 shown in FIG. 6B. The resistor 838 can be formed with respect to the surface 810 for example in a manner at least partly overlapping the first semiconductor zone 805. The resistor 838 can be formed within the first semiconductor zone 805 for example with respect to the surface 810. With the resistor 838 it is possible, for instance, to obtain an emitter negative feedback which counteracts current splitting and destruction of the ESD structure that is possibly associated therewith.

An electrical connection between the connection pillar 880 and the fourth semiconductor zone 865 can have, within the further contact structure 836, a further resistor 839, e.g. a resistor composed of doped semiconductor material such as doped polysilicon. The resistor 838 can have a resistance of less than 5 ohms, for example. The further resistor 839 can extend parallel to the fourth semiconductor zone 865 for example along a direction running perpendicularly to the plane of the drawing such as, for instance, the vertical direction 726 shown in FIG. 6B. The further resistor 839 can be formed with respect to the surface 810 for example in a manner at least partly overlapping the fourth semiconductor zone 865. With the further resistor 839 it is possible to obtain an emitter negative feedback in the parasitic lateral PNP transistor 870 which counteracts current splitting and destruction of the ESD structure that is possibly associated therewith.

The resistor and/or the further resistor are/is optional, such that, for example, a metallic short circuit is present between the connection pillar 880 and the fourth semiconductor zone 865 or between the first semiconductor zone 805 and the second semiconductor zone 815.

The second semiconductor zone, fourth semiconductor zone, the buried fifth semiconductor zone and also the connection zone as shown in the above examples can have, for example, a maximum dopant concentration in the range of $10^{18}$ cm$^{-3}$ to $10^{21}$ cm$^{-3}$.

A maximum dopant concentration of the third semiconductor zone can lie for example in the range of $10^{17}$ cm$^{-3}$ to $10^{19}$ cm$^{-3}$. The maximum dopant concentration of the first semiconductor zone can be, for example, less than $10^{18}$ cm$^{-3}$, in particular less than $5 \times 10^{17}$ cm$^{-3}$, and greater than the dopant concentration of the semiconductor body.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An integrated circuit, comprising:
    a semiconductor body of a first conductivity type, the semiconductor body comprising:
    a first semiconductor zone of a second conductivity type opposite the first conductivity type, said first semiconductor zone extending to a surface of the semiconductor body;
    a second semiconductor zone of the first conductivity type embedded in the first semiconductor zone and extending as far as the surface;
    a third semiconductor zone of the second conductivity type at least partly projecting from the first semiconductor zone along a lateral direction running parallel to the surface;
    a contact structure which provides an electrical contact with the first and second semiconductor zones at the surface;
    wherein the second semiconductor zone is arranged, along the lateral direction, between the part of the third semiconductor zone which projects from the first semiconductor zone and a part of the contact structure in contact with the first semiconductor zone;
    wherein the first, second and third semiconductor zones form a bipolar ESD structure having a vertical discharge current path with respect to the surface of the semiconductor body; and
    wherein an electrical breakdown voltage between the semiconductor body and the first and third semiconductor zones occurs in a location of a curvature of the part of the third semiconductor zone which projects from the first semiconductor zone so that the location of the electrical breakdown voltage is spatially decoupled from the vertical discharge current path of the bipolar ESD structure.

2. The integrated circuit as claimed in claim 1, wherein the third semiconductor zone extends to the surface and a surface region of the part of the third semiconductor zone which projects from the first semiconductor zone is free of an electrical contact-connection via said surface region.

3. The integrated circuit as claimed in claim 1, wherein the third semiconductor zone is buried within the semiconductor body.

4. The integrated circuit as claimed in claim 1, wherein the first semiconductor zone and the second semiconductor zone are electrically connected to one another via the contact structure and the electrical connection includes a resistor having a resistance of less than 5 ohms.

5. The integrated circuit as claimed in claim 4, wherein the electrical connection is a metallic short circuit.

6. The integrated circuit as claimed in claim 4, wherein the resistor comprises doped semiconductor material and is arranged with respect to the surface at least partly in a manner overlapping the first semiconductor zone.

7. The integrated circuit as claimed in claim 1, wherein the third semiconductor zone projects from the first semiconductor zone at opposite sides along the lateral direction.

8. The integrated circuit as claimed in claim 7, wherein the third semiconductor zone extends through the first semiconductor zone along the lateral direction.

9. The integrated circuit as claimed in claim 1, wherein the first, second and third semiconductor zones are radially symmetrical with a center of symmetry in the center of the first semiconductor zone.

10. The integrated circuit as claimed in claim 1, wherein the first, second and third semiconductor zones are arranged as strips.

11. The integrated circuit as claimed in claim 1, wherein the first semiconductor zone extends into the semiconductor body more deeply than the third semiconductor zone, and the third semiconductor zone extends into the semiconductor body more deeply than the second semiconductor zone.

12. The integrated circuit as claimed in claim 1, further comprising a field plate arranged above the surface and configured to influence the electric field curvature in a region between the second semiconductor zone and the semiconductor body.

13. The integrated circuit as claimed in claim 1, wherein a maximum dopant concentration of the second semiconductor zone is greater than $10^{18}$ cm$^{-3}$, and a maximum dopant concentration of the first semiconductor zone is less than $10^{18}$ cm$^{-3}$.

14. The integrated circuit as claimed in claim 1 further comprising:
    a fourth semiconductor zone of the second conductivity type extending to the surface of the semiconductor body, wherein the fourth semiconductor zone is spaced apart from the second semiconductor zone along the lateral direction and electrically connected to a pin that differs from a pin to which the first and second semiconductor zones are electrically connected.

15. The integrated circuit as claimed in claim 14, wherein a vertical dopant profile of the third semiconductor zone with respect to the surface corresponds to a dopant profile of the fourth semiconductor zone.

16. The integrated circuit as claimed in claim 14, further comprising:
    a semiconductor connection zone of the first conductivity type electrically connected to the semiconductor body.

17. The integrated circuit as claimed in claim 16, wherein the semiconductor connection zone and the fourth semiconductor zone are electrically connected and the electrical connection includes a resistor having a resistance of less than 5 ohms.

18. The integrated circuit as claimed in claim 17, wherein the electrical connection is a metallic short circuit.

19. The integrated circuit as claimed in claim 17, wherein the resistor comprises doped semiconductor material and is arranged with respect to the surface at least partly in a manner overlapping at least one zone from the semiconductor connection zone and the fourth semiconductor zone.

20. The integrated circuit as claimed in claim 1, further comprising:
    a fifth semiconductor zone of the first conductivity type buried in the semiconductor body and electrically connected via the surface.

* * * * *